(12) United States Patent
Chien et al.

(10) Patent No.: US 9,591,242 B2
(45) Date of Patent: Mar. 7, 2017

(54) BLACK LEVEL CONTROL FOR IMAGE SENSORS

(71) Applicant: Taiwan Semiconductor Manufacturing Company, Ltd., Hsin-Chu (TW)

(72) Inventors: Volume Chien, Sinying (TW); Yun-Wei Cheng, Taipei (TW); Che-Min Lin, Tainan (TW); Shiu-Ko JangJian, Tainan (TW); Chi-Cherng Jeng, Madou Township (TW); Chih-Mu Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 30 days.

(21) Appl. No.: 13/944,629

(22) Filed: Jul. 17, 2013

(65) Prior Publication Data

US 2014/0211057 A1 Jul. 31, 2014

Related U.S. Application Data

(60) Provisional application No. 61/759,031, filed on Jan. 31, 2013.

(51) Int. Cl.
*H04N 5/361* (2011.01)
*H01L 27/146* (2006.01)

(52) U.S. Cl.
CPC ......... *H04N 5/361* (2013.01); *H01L 27/1462* (2013.01); *H01L 27/1464* (2013.01); *H01L 27/14609* (2013.01); *H01L 27/14623* (2013.01)

(58) Field of Classification Search
CPC .............. H04N 5/361; H01L 27/14609; H01L 27/1462; H01L 27/14623; H01L 27/1464; H01L 27/14627; H01L 27/1463
USPC .... 348/243, 245, 308; 257/432, 447; 438/73
See application file for complete search history.

(56) References Cited

U.S. PATENT DOCUMENTS

| | | | | |
|---|---|---|---|---|
| 7,547,573 B2* | 6/2009 | Wen | .................. | H01L 27/14623 438/144 |
| 7,755,679 B2* | 7/2010 | Rossi | ..................... | H04N 5/361 348/243 |
| 7,999,340 B2* | 8/2011 | Rossi | ................ | H01L 27/14603 257/184 |
| 8,233,066 B2* | 7/2012 | Zheng | ................. | H01L 27/1461 257/432 |
| 2006/0114343 A1* | 6/2006 | Zhang et al. | .................. | 348/294 |
| 2008/0150057 A1* | 6/2008 | Lee | ................... | H01L 27/14623 257/432 |
| 2008/0197268 A1* | 8/2008 | Kameda | ..................... | 250/208.1 |
| 2008/0308890 A1* | 12/2008 | Uya | .................. | H01L 27/14603 257/437 |

(Continued)

*Primary Examiner* — Lin Ye
*Assistant Examiner* — Chriss Yoder, III
(74) *Attorney, Agent, or Firm* — Slater Matsil, LLP

(57) ABSTRACT

An embodiment image sensor includes a pixel region spaced apart from a black level control (BLC) region by a buffer region. In an embodiment, a light shield is disposed over the BLC region and extends into the buffer region. In an embodiment, the buffer region includes an array of dummy pixels. Such embodiments effectively reduce light cross talk at the edge of the BLC region, which permits more accurate black level calibration. Thus, the image sensor is capable of producing higher quality images.

20 Claims, 3 Drawing Sheets

(56) References Cited

U.S. PATENT DOCUMENTS

| | | | |
|---|---|---|---|
| 2010/0134667 A1* | 6/2010 | Suzuki | H04N 5/3572 348/294 |
| 2011/0032391 A1* | 2/2011 | Cheung | 348/241 |
| 2011/0149137 A1* | 6/2011 | Koike | H01L 27/14603 348/308 |
| 2012/0001286 A1* | 1/2012 | Yoon | 257/432 |
| 2012/0242874 A1* | 9/2012 | Noudo | H01L 27/1464 348/294 |
| 2013/0113968 A1* | 5/2013 | Lenchenkov | H01L 27/14623 348/302 |

\* cited by examiner

BLACK LEVEL CONTROL FOR IMAGE SENSORS

CROSS-REFERENCE TO RELATED APPLICATIONS

This application claims the benefit of U.S. Provisional Application No. 61/759,031, filed on Jan. 31, 2013, entitled "Black Level Control For Image Sensors," which application is hereby incorporated herein by reference.

BACKGROUND

Complementary metal oxide semiconductor (CMOS) image sensors are gaining in popularity over traditional charged-coupled devices (CCDs) due to certain advantages inherent in the CMOS image sensors. In particular, CMOS image sensors typically require lower voltages, consume less power, enable random access to image data, may be fabricated with compatible CMOS processes, and enable integrated single-chip cameras relative to CCDs.

CMOS image sensors utilize light-sensitive CMOS circuitry to convert light energy into electrical energy. The light-sensitive CMOS circuitry typically comprises a photodiode formed in a silicon substrate. As the photodiode is exposed to light, an electrical charge is induced in the photodiode. The photodiode is typically coupled to a MOS switching transistor, which is used to sample the charge of the photodiode. Colors may be determined by placing filters over the light-sensitive CMOS circuitry.

The light received by pixels of the CMOS image sensor is often based on the three primary colors: red, green, and blue (R, G, B), and additional colors can be identified and/or created with various combinations and intensities (e.g. when red and green overlap they form yellow).

Pixel sensitivity for receiving the incident light, however, is lowered with the trend of size reduction of pixels of the CMOS image sensor. In addition, cross-talk is caused between different pixels against the incident light, especially against the incident light with long wavelength such as the right light (wavelength of about 650 nm). As such, the overall performance of pixels of the CMOS image sensor may be degraded.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely a complementary metal oxide semiconductor (CMOS) image sensor. The disclosure may also be applied, however, to other integrated circuits, electronic structures, and the like.

The complementary metal oxide semiconductor image sensor may be formed in either a front side illumination (FSI) configuration or a back-side illumination (BSI) configuration. In a front-side illumination configuration, light passes to the photodiode from the "front" side of the image sensor where the transfer transistor has been formed. However, forcing the light to pass through any overlying metal layers, dielectric layers, and past the transfer transistor before it reaches the photodiode may generate processing and/or operational issues as the metal layers, dielectric layers, and the transfer transistor may not necessarily be translucent and easily allow the light to pass through.

In the BSI configuration, the transfer transistor, the metal layers, and the dielectric layers are formed on the front side of the substrate and light is allowed to pass to the photodiode from the "back" side of the substrate. As such, the light hits the photodiode before reaching the transfer transistor, the dielectric layers, or the metal layers. Such a configuration may reduce the complexity of the manufacturing of the image sensor and improve the image sensor operation.

Figure 1:
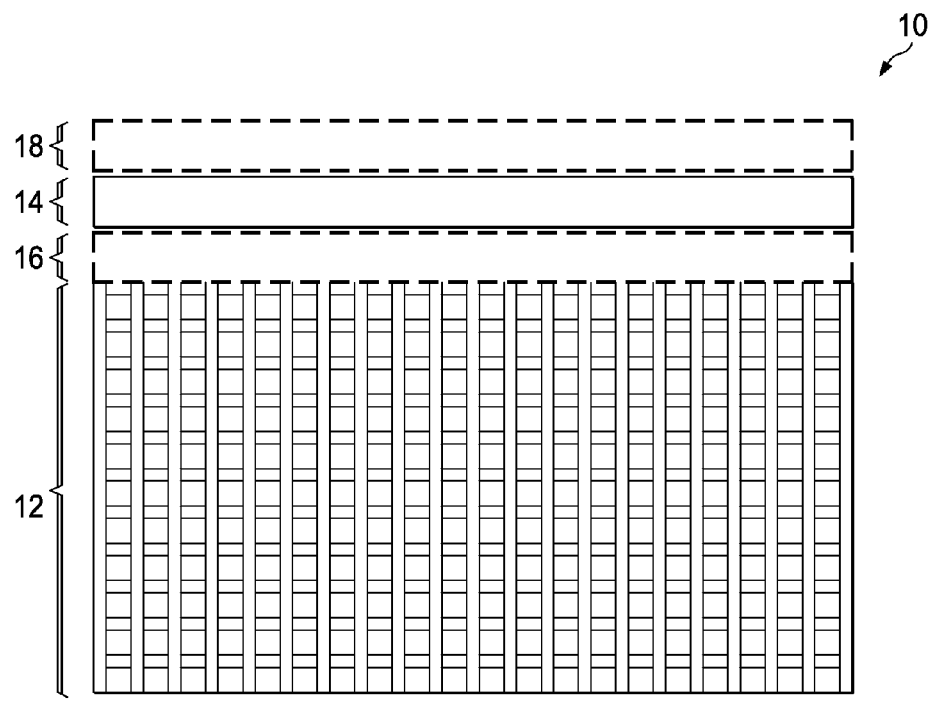
FIGS. 1-2 illustrate a plan and cross section view of a representative portion of an embodiment image sensor.
Figure 2:
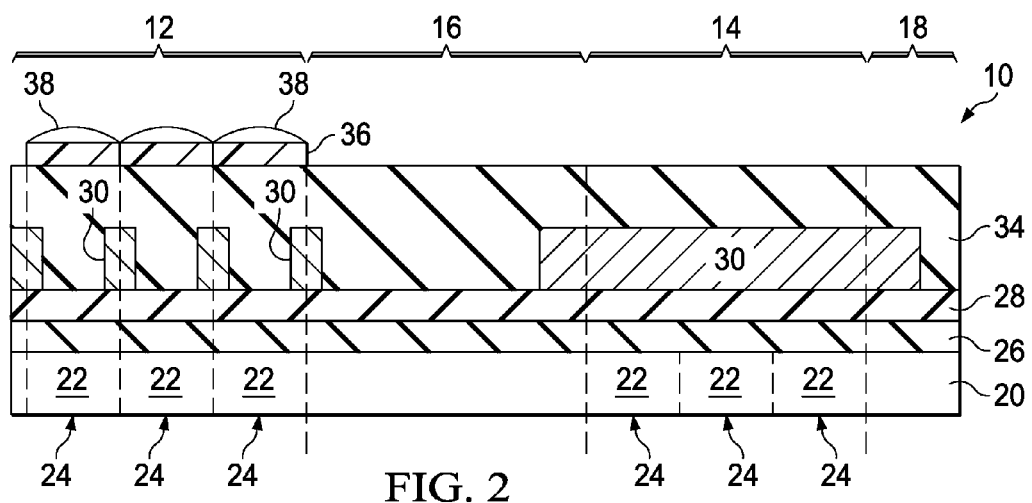

Referring collectively to FIGS. 1-2, a representative portion of an embodiment image sensor 10 is illustrated. In an embodiment, the image sensor 10 is a back-side image sensor. As shown, the image sensor 10 includes a pixel region 12, a black level control (BLC) region 14, and a buffer region 16. As shown in FIG. 1, the buffer region 16 is generally disposed in between the pixel region 12 (a.k.a., the imaging pixel region) and the BLC region 14. In an embodiment, the image sensor 10 also includes a surrounding region 18. The surrounding region 18 is generally disposed on a side of the BLC region 14 opposite the buffer region 16 and/or the pixel region 12.

Referring now to FIG. 2, the image sensor 10 includes a substrate 20. In an embodiment, the substrate 20 is formed from silicon. However, in other embodiments the substrate may be formed from other suitable semiconductor materials. As shown in FIG. 2, the substrate 20 contains or supports a plurality of photo-sensitive elements such as, for example, photodiodes 22. In an embodiment, a single photodiode 22 is disposed in each pixel 24 in the pixel region 12 and in each pixel 24 in the BLC region 14. Even so, it should be understood that several of the photodiodes 22 may be found in one or more of the pixels 24 in other embodiments. Moreover, each pixel 24 in the pixel region 12 and in the BLC region 14 may include other image sensor circuitry (e.g., a transistor, etc.), which has not been shown for ease of illustration.

Still referring to FIG. 2, an anti-reflective coating (ARC) 26 is disposed over the substrate 20. The anti-reflective coating 26 is formed over the substrate 20 to reduce reflection of incident light. In an embodiment, the anti-reflective coating 26 may be formed from, for example, silicon carbide (SiC), silicon nitride (SiN), or a high-k dielectric film.

The image sensor 10 also includes a buffer layer 28. As shown in FIG. 2, the buffer layer 28 is generally formed on the anti-reflective coating 26. In an embodiment, the buffer layer 28 is formed from a suitable oxide such as, for example, a plasma enhanced oxide (PEOx). In some cases, the buffer layer 28 and the anti-reflective coating 26 are collectively referred to as a backside illuminating (BSI) film.

Still referring to FIG. 2, a grid 30 is disposed over the buffer layer 28 within the pixel region 12. As shown, a peripheral portion of the grid 30 may extend or overlap somewhat into the buffer region 16. In an embodiment, the grid 30 is formed from a metal such as, for example, tungsten, aluminum, copper, an alloy or composite. In an embodiment, the grid 30 is formed from a low refractive index material such as, for example, an oxide. As shown in FIGS. 1-2, the grid 30 has walls that project above the substrate 20 and form cavities therebetween.

The grid 30 functions to prevent cross-talk between the photodiodes 22 in adjacent pixels 24 in the pixel region 12. Indeed, undesirable cross-talk may occur when light from one pixel 24 makes its way into the photodiode 22 of an adjacent pixel 24, thereby causing the adjacent pixel 24 to sense the light. Such cross-talk can reduce the precision and the quantum efficiency of the image sensor 10.

Referring to FIG. 2, a light shield 32 (a.k.a., a light shield layer) is disposed over the buffer layer 28 within the BLC region 14. In an embodiment, the light shield 32 is formed from a metal such as, for example, tungsten, aluminum, copper, an alloy or composite. In an embodiment, the light shield 32 is formed from a low refractive index material such as, for example, an oxide.

The light shield 32 blocks light incident from entering the photodiodes 22 in the BLC region 14. Therefore, the BLC region 14 is able to define the black level for the image sensor 10. In other words, the BLC region 14 defines what is black for color image reproduction in software interpolation. Therefore, the image sensor 10 is able to reproduce color images.

As shown in FIG. 2, in an embodiment the light shield 32 extends outside or beyond the BLC region 14. In other words, the light shield 32 projects or extends into the buffer region 16. In an embodiment, the light shield 32 also projects or extends into the surrounding region 18. As shown in FIG. 2, the width of the light shield 32 is generally larger than the width of the BLC region 14.

In an embodiment, the light shield 32 can be extended in all directions from the BLC region 14 a distance between about 5% and about 100% the distance between the BLC region 14 and the pixel region 12. In other words, the light shield 32 may cover all or only a portion of the buffer region 16.

By permitting the light shield 32 to occupy at least portion of the buffer region 16 and/or the surrounding region 18, the light shield 32 has an enhanced light blocking capability, which provides for more accurate black level calibration while reducing stress-induced degradation on the periphery of BLC region 14. In other words, extending the light shield 32 can improve the non-uniform stress distribution in the BLC region 14 originally from the edge of the deposited film. In addition, such a configuration as disclosed above may reduce light crosstalk at the edge of BLC region 14 to achieve more accurate black level calibration. In embodiments, no process changes or additional masks are needed to form the light shield 32.

Still referring to FIG. 2, a dielectric layer 34 is disposed over the metal grid 30 generally occupying the pixel region 12, over the exposed portions of the buffer layer 28 in the buffer region 16, and over the light shield 32 occupying the buffer region 16, the BLC region 14, and the surrounding region 18.

As shown in FIG. 2, a plurality of color filters 36 is disposed on the dielectric layer 34. In an embodiment, one of the color filters 36 is disposed over and vertically aligned with one of the photodiodes 22 in the pixels 24 in the pixel region 12 of the image sensor 10. The color filters 36 may vary in color including, for example, red, green, blue, white, and so on. In an embodiment, the color filters 36 are each formed from a suitable polymer material. However, other suitable color filter materials may be used in other embodiments.

Still referring to FIG. 2, a microlens 38 may be formed over each of the color filters 36. The microlens 38 operates to collect and focus the incoming light for the underlying photodiodes 22. By doing so, the microlens 38 aids in the sensitivity of the photodiodes 22 and thereby improves the quality of the images offered by the image sensor 10.

Figure 3:
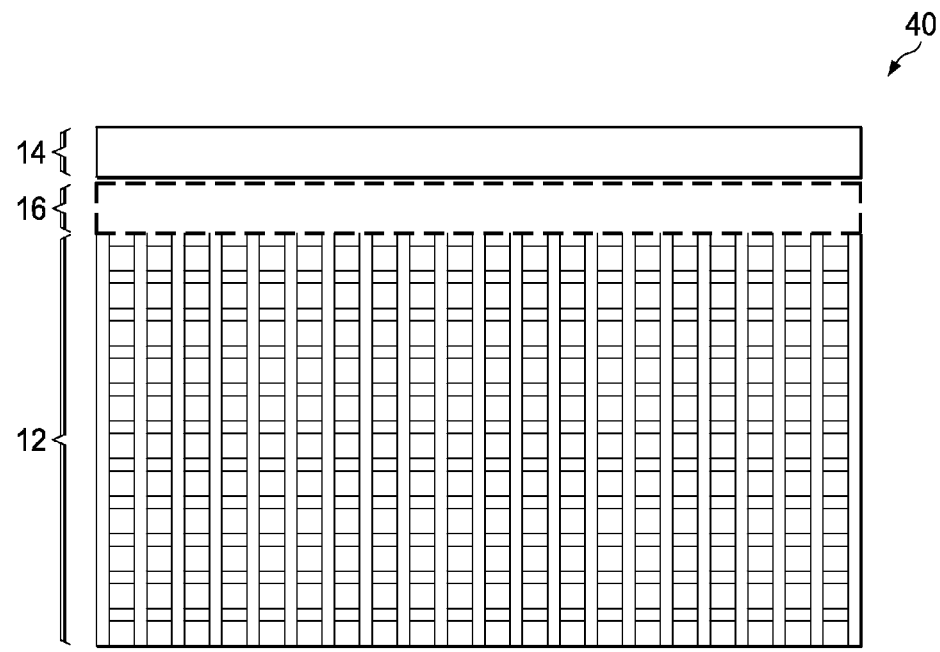
FIGS. 3-4 illustrate a plan and cross section view of a representative portion of an embodiment image sensor.
Figure 4:
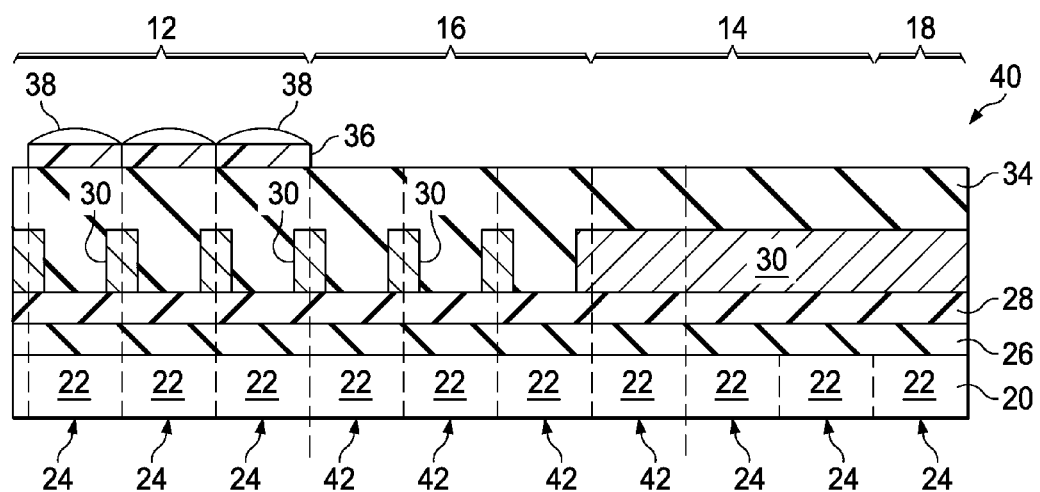

Referring now to FIGS. 3-4, a representative portion of an embodiment image sensor 40 is illustrated. The image sensor 40 shares several of the same features as the image sensor 10 of FIG. 1. Therefore, the same reference numbers have been used to identify the shared features. In addition, a detailed description of the shared features will not be repeated for the sake of brevity. Also, while the surrounding region 18 (FIG. 1) has not been illustrated in FIG. 3, in an embodiment the image sensor 40 may include this feature.

Referring now to FIG. 4, the image sensor 40 includes a plurality of dummy pixels 42 occupying the buffer region 16. As shown, each of the dummy pixels 42 in the buffer region 16 includes at least one photodiode 22. As depicted in FIG. 4, the photodiodes 22 in the buffer region 16 generally merge the photodiodes 22 in the pixel region 12 with the photodiodes 22 in the BLC region 14. In other words, in an embodiment the substrate 20 supports a continuous array of photodiodes 22 extending through the pixel region 12, the buffer region 16, and the BLC region 14. By forming a continuous array of photodiodes 22, process uniformity may be improved.

Notably, the BLC region 14 and the pixel region 12 were typically separated in order to reduce contaminating the black level calibration when sensing incident light in the pixel region 12. In some situations, the separated pixel design may cause process non-uniformity due to pattern density and the corresponding loading effect. The distribution of the resulting dark current (DC) in both regions may be different, which may lead to a tailing BLC ratio and a lowered yield.

Moreover, the gap between the pixel region 12 and the BLC region 14 is not limited to any specific structure (e.g., dummy pixels 42, etc.). Rather, the purpose of the space between the pixel region 12 and the BLC region 14 is to segregate photodiodes 22 in the BLC region 14 from those in the pixel region 12. The gap may reduce the effect of light sensing in the pixel region 12 on the black level correction occurring in the BLC region 14.

In an embodiment, the metal grid 30 extends into the buffer region 16 and is vertically aligned with at least one of the photodiodes 22 in the buffer region 16. Likewise, in an embodiment the light shield extends into the buffer region 16 and covers at least one of the photodiodes 22 in the buffer region 16. It should be recognized that extending the grid 30 and/or the light shield 32 into the buffer region 16 and over the photodiodes 22 therein is optional.

Embodiments such as those discussed above may reduce the process deviation and thus maintain the distribution of the dark current in the BLC region 14 and the pixel region 12. The BLC ratio non-uniform problem can be improved. The black level may be more accurately calculated by reducing the interference of incident light by forming the light shielding on top of the dummy pixel 42 on the periphery of BLC region 14. Additionally, no process changes or additional masks may be needed.

It should be recognized that the image sensors 10, 40 illustrated in FIGS. 1-4 may include numerous other structures, features, layers, and so on in practical applications. However, these have not been illustrated or discussed herein for brevity.

Figure 5A:
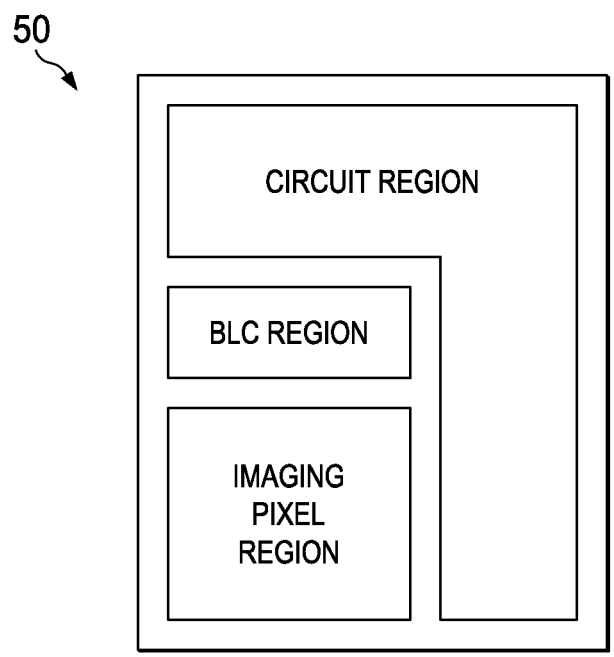
FIGS. 5A-5B illustrate a conventional back-side image sensor and a three dimensional (stacked) back-side image sensor.
Figure 5B:
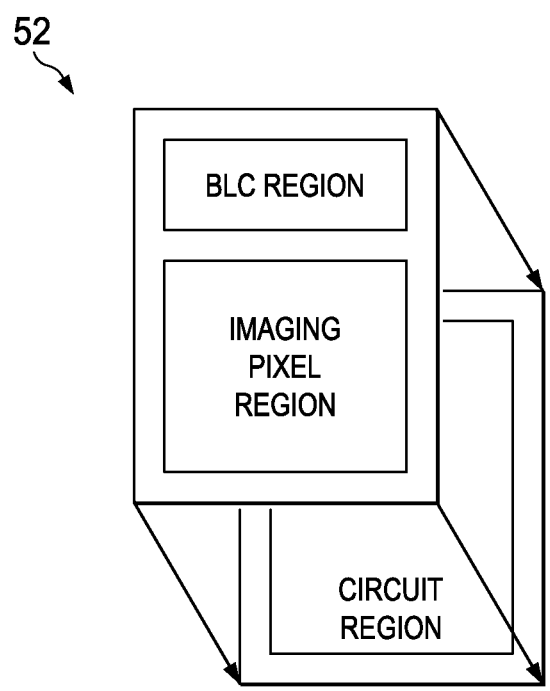

Referring now to FIGS. 5A-5B, a conventional BSI image sensor 50 and a three dimensional (3D) BSI image sensor 52 are shown. As pixels continue to shrink, the 3D or stacked image sensors 52 become more and more important. The separation of pixel and circuit components reduces the required area of a device. The chip edge will be pushed to the edge of BLC and imaging pixel regions. The light shielding metal layer may extend into the surface of the circuit region. Extending the metal shielding layer may provide additional advantages when the chip size shrinks because the metal shielding layer may extend for better light blocking and stress reduction. Therefore, the use of an extended light shield layer, as disclosed herein, may be suitable for use in 3D image sensors 52 as shown in FIG. 5B.

From the foregoing, it should be recognized that by extending the light shield 32 and/or the metal grid 30 into the buffer region 16 or by incorporating dummy pixels 42 into the buffer region, numerous advantages are realized. For example, light crosstalk at the edge of the BLC region 14 is reduced, which allows for better black level calibration.

An embodiment image sensor includes a pixel region spaced apart from a black level control (BLC) region by a buffer region and a light shield disposed over the BLC region and extending into the buffer region.

An embodiment image sensor includes a pixel region spaced apart from a black level control (BLC) region by a buffer region, a light shield disposed over the BLC region, and one or more dummy pixels disposed in the buffer region.

An embodiment image sensor includes a pixel region including a first array of photodiodes, a buffer region laterally adjacent the pixel region, a black level control (BLC) region laterally adjacent the buffer region, the BLC region including a second array of photodiodes, and a light shield covering the second array of photodiodes in the BLC region and preventing light from reaching at least a portion of the buffer region.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An image sensor, comprising:
a pixel region spaced apart from a black level control (BLC) region by a buffer region, the buffer region including an array of dummy pixels, wherein the buffer region is a microlens-free region;
a metal grid over the pixel region and at least one dummy pixel, wherein the metal grid extends along opposing sides of the at least one dummy pixel in a plan view; and
a light shield disposed over the BLC region and extending into the buffer region.

2. The image sensor of claim 1, wherein the light shield is disposed over at least one dummy pixel.

3. The image sensor of claim 1, wherein the light shield extends into a surrounding region, the surrounding region on an opposing side of the BLC region as the buffer region.

4. The image sensor of claim 1, wherein a dielectric layer is disposed over top and sidewall surfaces of the light shield extending into the buffer region.

5. The image sensor of claim 1, wherein a first plurality of photodiodes in the pixel region and a second plurality of photodiodes in the BLC region share a same silicon substrate.

6. The image sensor of claim 1, wherein the light shield in the buffer region is co-planar with the metal grid disposed over photodiodes in the pixel region.

7. The image sensor of claim 1, wherein the light shield in the BLC region and the buffer region is disposed on a buffer layer supported by an anti-reflective coating.

8. The image sensor of claim 1, wherein the light shield comprises metal.

9. An image sensor, comprising:
a pixel region spaced apart from a black level control (BLC) region by a buffer region;
a light shield disposed over the BLC region;
a plurality of dummy pixels disposed in the buffer region;
microlenses over the pixel region, wherein the microlenses do not extend over the buffer region and the BLC region; and
a metal grid over the pixel region and the buffer region, wherein at least a portion of the metal grid extends between adjacent dummy pixels in a plan view.

10. The image sensor of claim 9, wherein at least one of the dummy pixels is covered by the light shield.

11. The image sensor of claim 9, wherein the light shield and the metal grid are co-planar.

12. The image sensor of claim 9, wherein the light shield extends into a surrounding region, the surrounding region on an opposing side of the BLC region as the buffer region.

13. The image sensor of claim 9, wherein a dielectric layer is disposed over at least one of top and sidewall surfaces of the light shield extending into the buffer region.

14. The image sensor of claim 9, wherein a dielectric layer and a buffer layer are on opposing sides of the metal grid in the buffer region.

15. The image sensor of claim 9, wherein a dielectric layer and a buffer layer are on opposing sides of the light shield in the buffer region.

16. The image sensor of claim 9, wherein the metal grid completely covers the buffer region.

17. An image sensor, comprising:
a pixel region including a first array of photodiodes;
a buffer region laterally adjacent the pixel region;
a black level control (BLC) region laterally adjacent the buffer region, the buffer region including a second array of photodiodes and the BLC region including a third array of photodiodes, the second array of photodiodes being arranged such that a plurality of pixels are formed along a shortest line between the pixel region and the BLC region, the plurality of pixels being arranged into a plurality of rows and a plurality of columns, the second array of photodiodes being dummy pixels, the buffer region being a microlens-free region; and
a light shield covering the third array of photodiodes in the BLC region and preventing light from reaching at least a portion of the buffer region.

18. The image sensor of claim 17, wherein the light shield prevents light from reaching at least one photodiode of the second array of photodiodes.

19. The image sensor of claim 17, wherein the light shield extends into a surrounding region adjacent the BLC region.

20. The image sensor of claim 17, wherein a width of the light shield is greater than a width of the BLC region.

* * * * *